(12) United States Patent
Tanzawa et al.

(10) Patent No.: US 11,735,264 B2
(45) Date of Patent: Aug. 22, 2023

(54) DRIVE CIRCUIT AND ELECTRONIC DEVICE

(71) Applicant: NATIONAL UNIVERSITY CORPORATION SHIZUOKA UNIVERSITY, Shizuoka (JP)

(72) Inventors: Toru Tanzawa, Hamamatsu (JP); Kazuki Matsuyama, Hamamatsu (JP)

(73) Assignee: National University Corporation Shizuoka University

( * ) Notice: Subject to any disclaimer, the term of this patent is extended or adjusted under 35 U.S.C. 154(b) by 265 days.

(21) Appl. No.: 17/295,075

(22) PCT Filed: Nov. 18, 2019

(86) PCT No.: PCT/JP2019/045128
§ 371 (c)(1),
(2) Date: May 19, 2021

(87) PCT Pub. No.: WO2020/105596
PCT Pub. Date: May 28, 2020

(65) Prior Publication Data
US 2022/0093177 A1    Mar. 24, 2022

(30) Foreign Application Priority Data
Nov. 20, 2018   (JP) .................. 2018-217136

(51) Int. Cl.
*G11C 17/18*    (2006.01)
*G11C 16/08*    (2006.01)
(Continued)

(52) U.S. Cl.
CPC .......... *G11C 16/08* (2013.01); *G11C 16/0483* (2013.01); *G11C 16/32* (2013.01); *G11C 16/26* (2013.01)

(58) Field of Classification Search
CPC ..................................... G11C 17/18
See application file for complete search history.

(56) References Cited

U.S. PATENT DOCUMENTS

2005/0013175 A1    1/2005  Bae ................. 365/189.09
2012/0120729 A1    5/2012  Yuh ................. 365/185.19
(Continued)

FOREIGN PATENT DOCUMENTS

JP    2006-309916 A    11/2006
JP    2007-149312 A    6/2007
(Continued)

OTHER PUBLICATIONS

International Search Report dated Feb. 10, 2020 in corresponding International Application No. PCT/JP2019/045128.
(Continued)

*Primary Examiner* — Jason Lappas
(74) *Attorney, Agent, or Firm* — Ostrolenk Faber LLP

(57) ABSTRACT

A NAND flash memory according to an embodiment includes a memory array, a detection circuit, and a drive circuit. The drive circuit is a circuit for driving a plurality of linearly arranged memory cells through a linear word line connected to the plurality of memory cells. The drive circuit has a function of generating a drive voltage in which a pre-pulse having a predetermined amplitude value is set at a timing corresponding to rising of a voltage signal, which rises stepwise by a voltage value, and applying the drive voltage to the word line and a function of detecting a voltage value at a predetermined position of the word line and setting a time width of the pre-pulse according to the detected voltage value.

14 Claims, 14 Drawing Sheets

(51) Int. Cl.
    *G11C 16/04*     (2006.01)
    *G11C 16/32*     (2006.01)
    *G11C 16/26*     (2006.01)

(56) References Cited

U.S. PATENT DOCUMENTS

| | | | |
|---|---|---|---|
| 2012/0170390 A1 | 7/2012 | Idgunji et al. | 365/194 |
| 2014/0119101 A1 | 5/2014 | Wang et al. | 365/154 |
| 2015/0221351 A1 | 8/2015 | Park et al. | |
| 2016/0035423 A1 | 2/2016 | Nam et al. | |
| 2017/0178742 A1* | 6/2017 | Qiu | G11C 17/16 |

FOREIGN PATENT DOCUMENTS

| | | |
|---|---|---|
| JP | 2010-129125 A | 6/2010 |
| JP | 2010-140554 A | 6/2010 |
| JP | 2011-018420 A | 1/2011 |
| JP | 2017-216025 A | 12/2017 |
| KR | 10-2016-0016386 A | 2/2016 |

OTHER PUBLICATIONS

English translation of the International Preliminary Report on Patentability dated May 20, 2021 with Notification from the International Bureau (Form PCT/IB/338) in corresponding PCT International Application No. PCT/JP2019/045128.

W. Jeong et al., "A 128 GB 3b/cell V-NAND Flash Memory With 1 GB/s I/O Rate", IEEE Journal of Solid-State Circuits, Jan. 2016, vol. 51, No. 1, pp. 204-209.

J. Bang et al., "A Load-Aware Pre-Emphasis Column Driver with 27% Settling-Time Reduction in ± 18% Panel-Load RC Delay Variation for 240Hz UHD Flat-Panel Displays", ISSCC 2016, Feb. 2, 2016, pp. 212-213.

K. Matsuyama and T. Tanzawa, "A closed-form expression for pre-emphasis pulses with minimal RC delay time", IEICE general conference, C-12-35, Mar. 2018.

\* cited by examiner (a)

(b)

(c)

(d)

(e)

(a)

(b)

(c)

DRIVE CIRCUIT AND ELECTRONIC DEVICE

CROSS-REFERENCE TO RELATED APPLICATIONS

The present application is a 35 U.S.C. §§ 371 national phase conversion of International Application No. PCT/JP2019/045128, filed Nov. 18, 2019, which claims priority to Japanese Patent Application No. 2018-217136, filed Nov. 20, 2018, the contents of both of which are incorporated herein by reference. The PCT International Application was published in the Japanese language.

TECHNICAL FIELD

One aspect of the present invention relates to a drive circuit and an electronic device for driving a plurality of cells.

BACKGROUND ART

A linear wiring portion, such as a word line and a gate line for driving memory cells or pixels arranged in a row, is provided in an electronic device, such as a semiconductor memory (a flash memory, a 3D cross-point memory, and the like), a flat panel display, a CMOS image sensor, and a touch panel display, which have become widespread in recent years. Since such a wiring portion has a parasitic resistance and a parasitic capacitance, a delay time determined by these occurs in a voltage signal propagating through the wiring portion. Therefore, in order to increase the speed of such an electronic device, how to shorten the signal delay time in the wiring portion becomes a problem. As a technique for shortening the delay time in such a wiring portion, a method called pre-emphasis is used in which a front part of the pulse waveform applied to the wiring portion is raised larger than usual (see Non Patent Literatures 1 to 3 below).

CITATION LIST

Non Patent Literature

Non Patent Literature 1: W. Jeong et al., "A 128 Gb 3b/cell V-NAND Flash Memory With 1 Gb/s I/O Rate" IEEE Journal of Solid-State Circuits, Vol. 51, No. 1, pp. 204-212, 2016.

Non Patent Literature 2: J. Bang, et al., "A Load-Aware Pre-Emphasis Column Driver with 27% Settling-Time Reduction in ±18% Panel-Load RC Delay Variation for 240 Hz UHD Flat-Panel Displays" ISSCC 2016.

Non Patent Literature 3: K. Matsuyama and T. Tanzawa, "A closed-form expression for pre-emphasis pulses with minimal RC delay time" IEICE general conference, C12-35, March 2018.

SUMMARY OF INVENTION

Technical Problem

In the conventional method described above, in order to realize the optimum characteristics corresponding to the manufacturing variation of each electronic device, the characteristics are measured for each electronic device and a pulse signal to be applied is calibrated. That is, since the parasitic resistance and the parasitic capacitance of the word line differ from product to product due to manufacturing variations, a test is performed for each product to correct the influence of the parasitic resistance and the parasitic capacitance, and a calibration is performed according to the test result so that the magnitude or time width of pre-emphasis is set in advance for each product. Therefore, there is a tendency to increase the test cost or the test time for the calibration process.

One aspect of the present invention has been made in view of the aforementioned problem, and an object of the present invention is to provide a drive circuit and an electronic device capable of reducing the test cost and the test time.

Solution to Problem

In order to solve the above problems, a drive circuit according to an embodiment of the present invention is a drive circuit for driving a plurality of linearly arranged cells through a linear wiring portion connected to the plurality of cells, and includes: a voltage application unit configured to generate a drive voltage in which a pre-pulse having a predetermined amplitude value is set at a timing corresponding to rising or falling of a voltage signal changing stepwise by a predetermined voltage value, and apply the drive voltage to the wiring portion; and a control unit configured to detect a voltage value at a predetermined position of the wiring portion and set a time width of the pre-pulse according to the detected voltage value.

Alternatively, an electronic device according to another embodiment of the present invention includes the drive circuit described above and a plurality of cells.

According to the drive circuit or the electronic device of the embodiment described above, in the drive circuit, the voltage value of the wiring portion is detected, the time width of the pre-pulse is set according to the voltage value, and the drive voltage in which a pre-pulse having the time width is set for a voltage signal that changes stepwise is applied to the wiring portion. Therefore, since the time width of the pre-pulse is set according to the voltage value of the wiring portion, it is possible to speed up the calibration of the drive voltage. As a result, it is possible to reduce the test cost and the test time for calibrating the drive voltage.

Advantageous Effects of Invention

According to one aspect of the present invention, it is possible to reduce the test cost and the test time.

DESCRIPTION OF EMBODIMENTS

Figure 1:
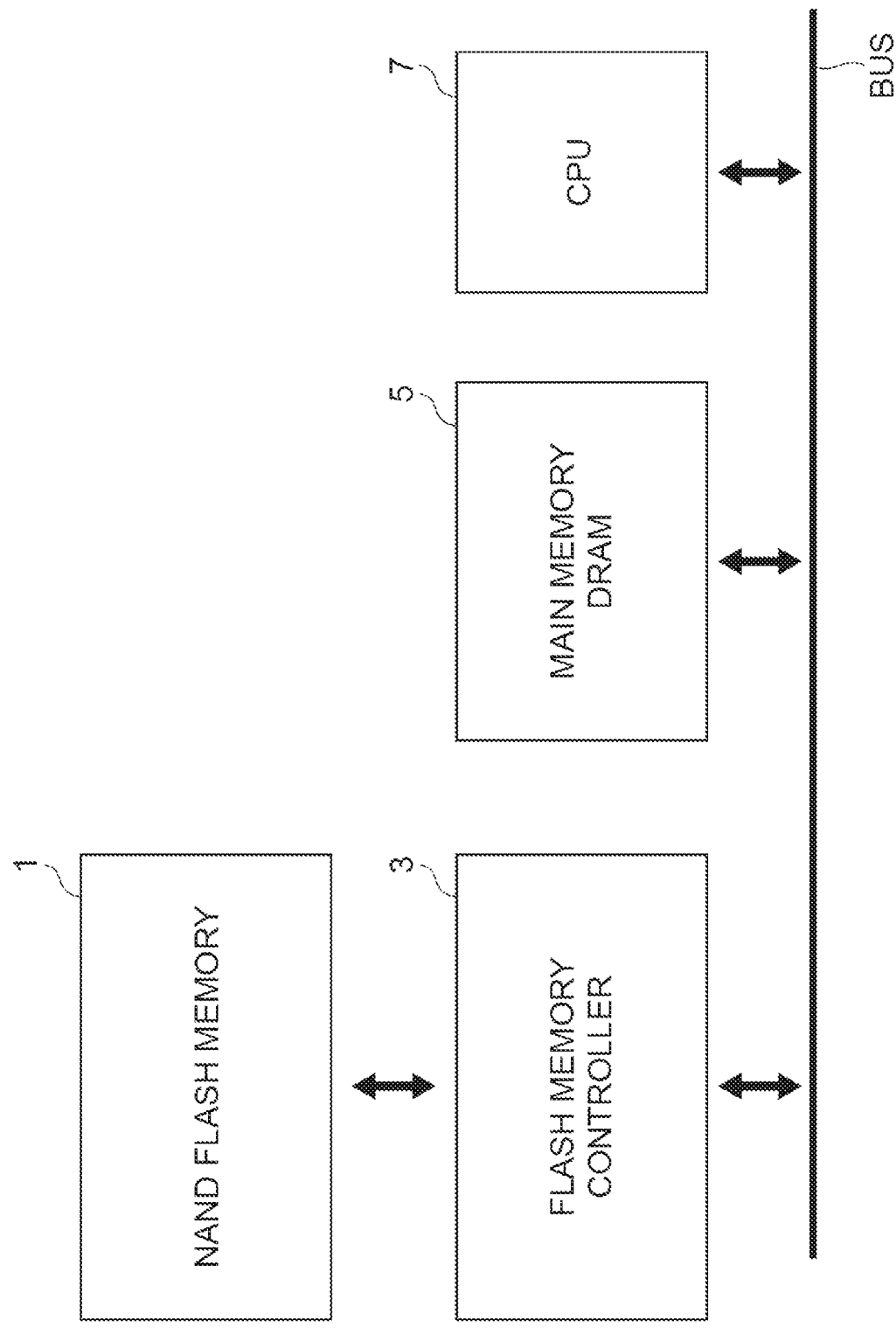
FIG. 1 is a diagram showing the schematic configuration of a computer system including a NAND flash memory according to a preferred embodiment of the present invention.

Hereinafter, preferred embodiments of an electronic device according to the present invention will be described in detail with reference to the diagrams. In addition, in the descriptions of the diagrams, the same or equivalent portions are denoted by the same reference numerals, and repeated descriptions thereof will be omitted.

As shown in FIG. 1, a NAND flash memory 1, which is an electronic device according to a preferred embodiment of the present invention, can be used as a computer system in combination with a flash memory controller 3, a main memory dynamic random access memory (DRAM) 5, and a central processing unit (CPU) 7. The flash memory controller 3 is an IC that controls the operation of the NAND flash memory 1, and can write data from the CPU 7 to the NAND flash memory 1 through a system bus BUS or can read the data of the NAND flash memory 1 from the CPU 7 through the system bus BUS. That is, in response to a command transmitted from the CPU 7 through the system bus BUS, the flash memory controller 3 controls the writing or reading of data at a predetermined address in the NAND flash memory 1 to relay the data to be written or the read data between the NAND flash memory 1 and the CPU 7.

Figure 2:
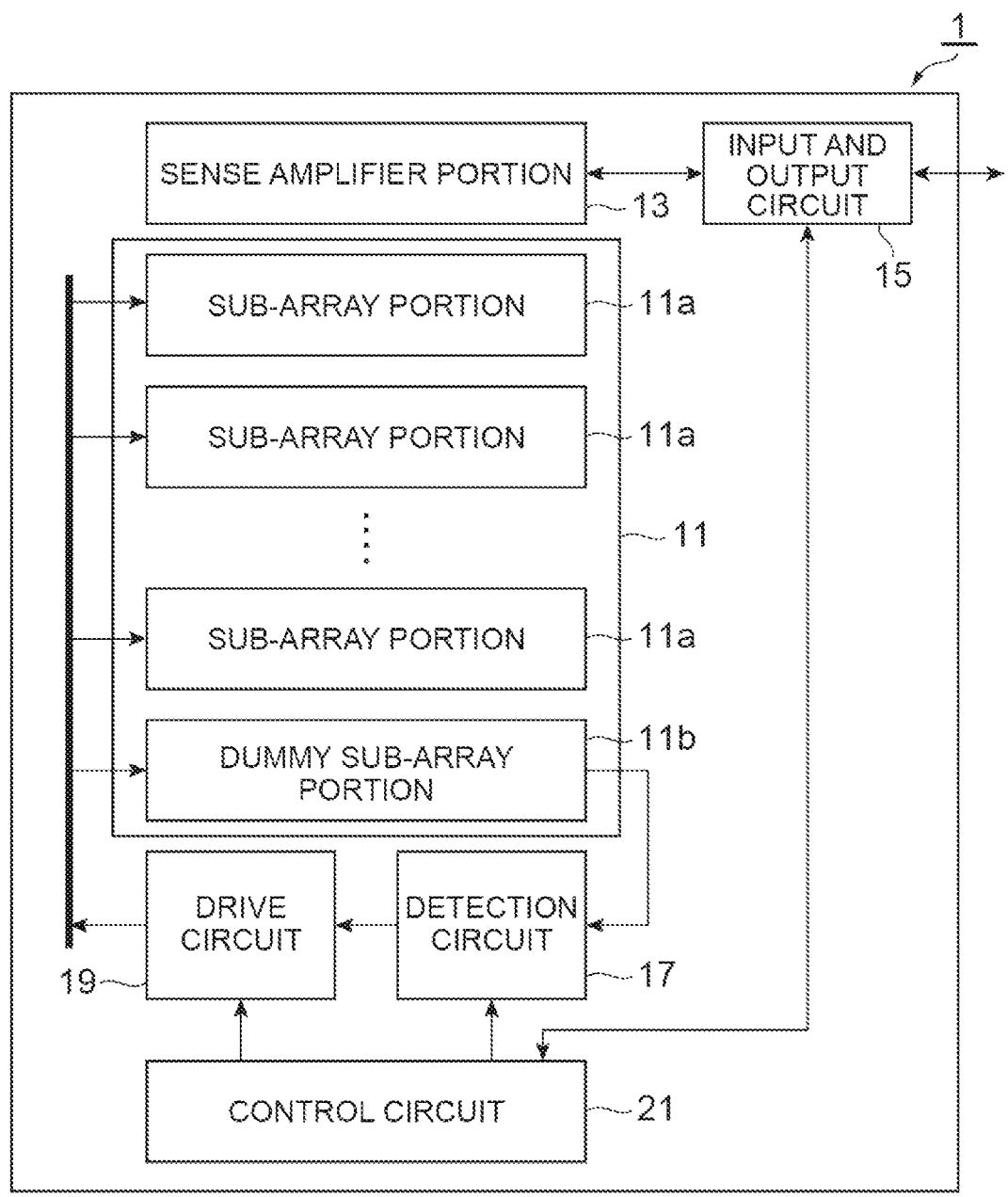
FIG. 2 is a block diagram showing the overall configuration of the NAND flash memory 1 in FIG. 1.

FIG. 2 is a block diagram showing the overall configuration of the NAND flash memory 1. The NAND flash memory 1 is a semiconductor memory in which a plurality of transistors (MOSFETs) are mounted on a semiconductor chip. As shown in FIG. 2, the NAND flash memory 1 is configured to include a memory array 11, a sense amplifier portion 13, an input and output circuit 15, a detection circuit 17, a drive circuit 19, and a control circuit 21. The memory array 11, the sense amplifier portion 13, the input and output circuit 15, the detection circuit 17, the drive circuit 19, and the control circuit 21 are formed on the same semiconductor chip.

The memory array 11 is configured by arranging a plurality of memory cells, which are transistors (MOSFETs), in a two-dimensional array, and has a function of storing binary or multi-value data in each of the memory cells. The memory array 11 includes a plurality of sub-array portions 11a, in which a plurality of memory cells are arranged in a one-dimensional (linear) manner, and a dummy sub-array portion 11b, in which a plurality of dummy memory cells are arranged in a one-dimensional (linear) manner. Here, the plurality of sub-array portions 11a and the dummy sub-array portion 11b are configured by a plurality of memory cells having the same configuration, the same number, and the same arrangement state, and the plurality of memory cells are provided adjacent to each other so as to be arranged in the same direction.

The sense amplifier portion 13 measures a current of a bit line electrically connected to each memory cell of the sub-array portion 11a, and determines the value of data stored in each memory cell according to the current. The input and output circuit 15 outputs the value of the data of each memory cell determined by the sense amplifier portion 13 to the outside (for example, the flash memory controller 3) as serial data. In addition, the input and output circuit 15 receives an input of the value of the data to be written to each memory cell from the outside (for example, the flash memory controller 3), and transmits the data to a circuit unit for data writing (not shown).

Figure 3:
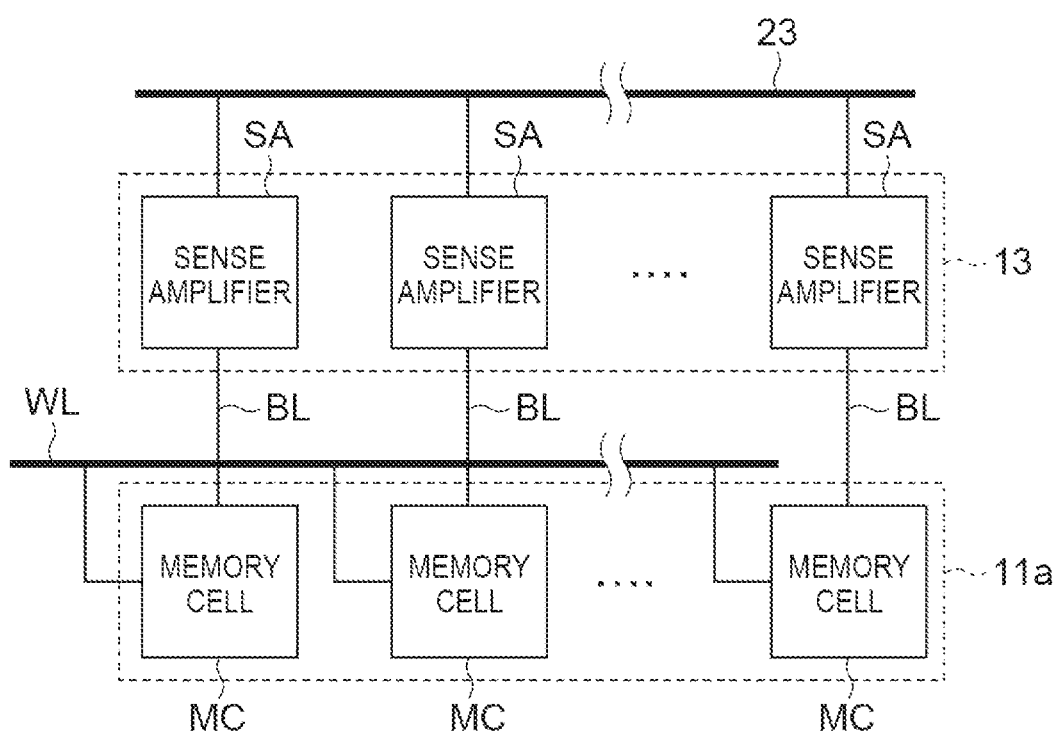
FIG. 3 is a diagram showing a circuit configuration around a memory cell of the NAND flash memory 1.

FIG. 3 shows a circuit configuration around a memory cell of the NAND flash memory 1. A word line WL that is one linear wiring portion is electrically connected to the gates of a plurality of (for example, 1024) memory cells MC linearly arranged in each sub-array portion 11a, and a plurality of (for example, 1024) sense amplifiers SA provided in the sense amplifier portion 13 so as to correspond to the memory cells MC are electrically connected to the drains of the plurality of memory cells MC through bit lines BL, which are a plurality of linear wiring portions, respectively. The word line WL is provided for each of the plurality of sub-array portions 11a and the dummy sub-array portion 11b, and each sense amplifier SA in the sense amplifier portion 13 is commonly provided for each corresponding memory cell MC in the plurality of sub-array portions 11a. When reading data from each memory cell MC, each sense amplifier SA detects the drain current of each memory cell MC according to the drive voltage, which is a stepped voltage signal applied to the word line WL, and determines the value of data stored in each memory cell MC by comparing the drain current with a threshold value. In addition, each of the plurality of sense amplifiers SA outputs the value of the data determined for each sub-array portion 11a, as serial data, to the input and output circuit 15 through a serial bus 23.

Returning to FIG. 2, the detection circuit 17 is electrically connected to the word line WL provided corresponding to the dummy sub-array portion 11b, detects a voltage value of a connection point at a predetermined position of the word line WL, and outputs a detection signal indicating the detected voltage value to the drive circuit 19. The drive circuit 19 is electrically connected to one end of each of the plurality of word lines WL provided corresponding to the plurality of sub-array portions 11a and the dummy sub-array portion 11b, and generates a drive voltage for driving the memory cell MC in the memory array 11 based on the detection signal output from the detection circuit 17 and applies the drive voltage to one end of each word line WL. Here, any position can be selected as a connection point between the detection circuit 17 and the word line WL. However, from the viewpoint of realizing high-speed driving of all the memory cells MC of the NAND flash memory 1, the other end on the opposite side of one end to which the drive voltage is applied is preferably set as the connection point between the detection circuit 17 and the word line WL.

The control circuit 21 controls the operation of writing data or reading data in the memory cell MC at a predetermined address in the NAND flash memory 1 in response to an instruction command from the outside (for example, the flash memory controller 3). For example, when writing data, the control circuit 21 controls the input and output circuit 15 and a circuit unit for data writing (not shown) to store the data in the memory cell MC at a predetermined address. In addition, when reading data, the control circuit 21 controls the detection circuit 17, the drive circuit 19, and the input and output circuit 15 to read the data from the memory cell MC at a predetermined address. That is, in response to the command input from the control circuit 21, the input and output circuit 15 outputs the value of the data read from the memory cell MC to the outside as serial data and transmits the data for writing received from the outside to the circuit inside the NAND flash memory 1.

Next, the details of the drive voltage generated by the drive circuit 19 described above will be shown first, and then the results of the theoretical analysis of the propagation state of the drive voltage in the word line WL by the present inventors will be shown.

Figure 4:
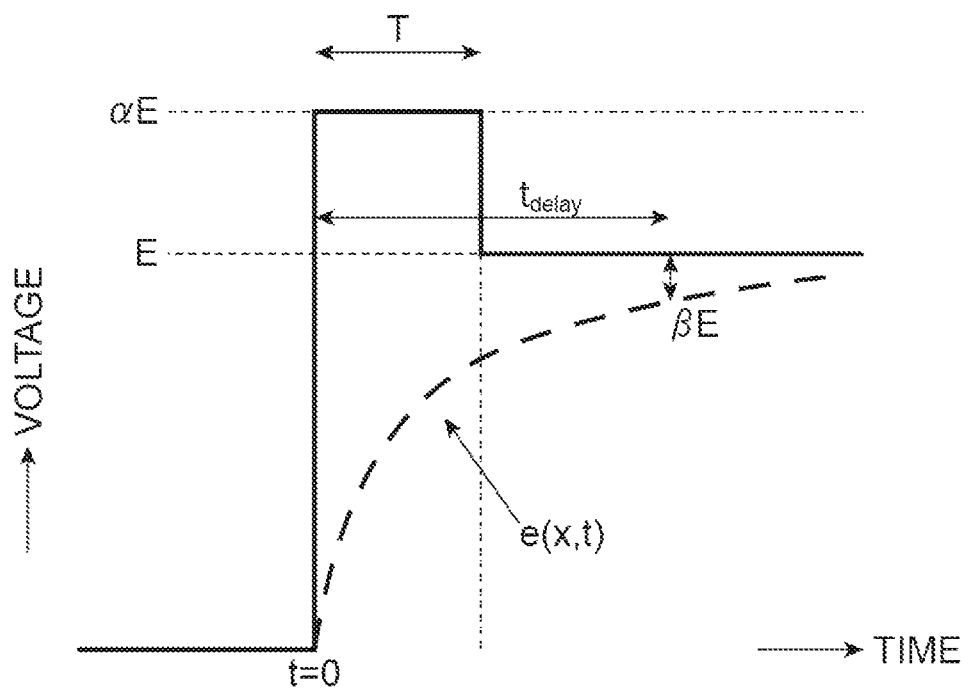
FIG. 4 is a diagram showing the waveform of a drive voltage generated by a drive circuit 19.

FIG. 4 shows the waveform of the drive voltage generated by the drive circuit 19. Assuming that the time t=0 at the start of reading data from the memory cell MC of each sub-array portion 11a, the drive circuit 19 generates a drive voltage, in which a pre-pulse having an amplitude value ($\alpha \times E$, $\alpha$ is a real number set in advance) is set, at the timing of time t=0 corresponding to the rising of the voltage signal that changes (rises) stepwise by a predetermined voltage value E. At this time, the drive circuit 19 sets a period (time width) T from the time t=0, in which a pre-pulse is set, so as to minimize the propagation delay time in the word line WL by a function described later. In other words, the drive circuit 19 sets the drive voltage so that, in the stepped voltage signal with the predetermined voltage value E that rises after time t=0, a pre-emphasis voltage with a voltage value of $\alpha \times E$ is generated in the period T at the front part corresponding to the rising of the stepped voltage signal.

Figure 5:
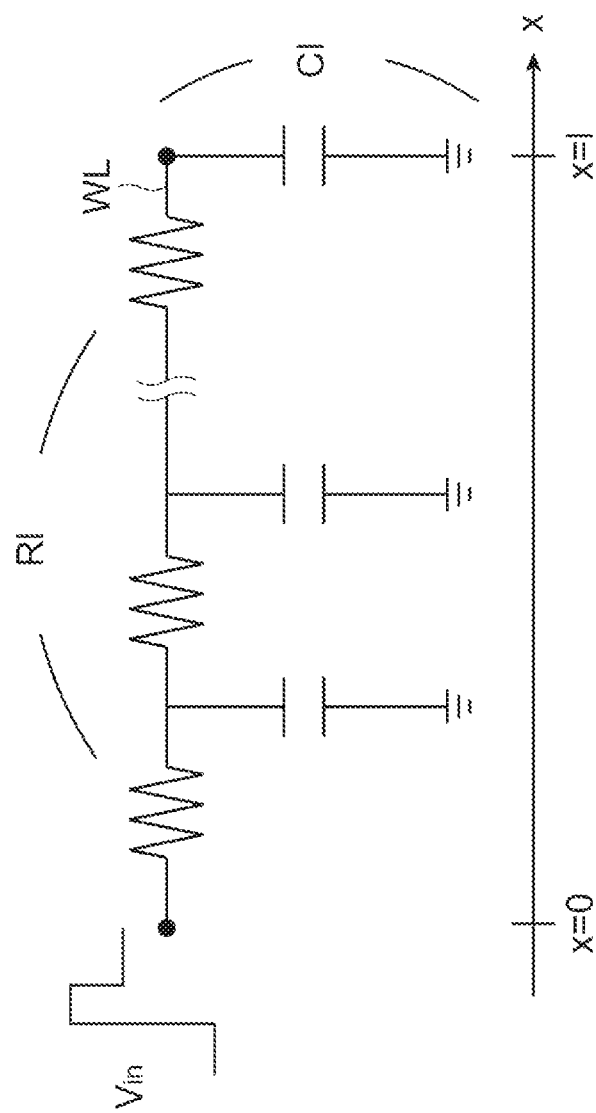
FIG. 5 is an equivalent circuit diagram of a word line WL.

The word line WL through which such a drive voltage propagates can be considered to be equivalent to a transmission line in which an impedance component and a capacitance component excluding a conductance component and a reactance component are distributed. Specifically, as shown in FIG. 5, the word line WL can be considered to be a transmission line having a length of 1 [m], a resistance of R [Ω/m] per unit length, and a capacitance of C [F/m] per unit length, and the total resistance can be estimated as R×1 [Ω] and the total capacitance can be estimated as C×1 [F]. In the following calculations, it is assumed that the position x of one end of the word line WL to which a drive voltage $V_{in}$ is applied is x=0 and the position x of the other end of the word line WL is x=1. In addition, it is assumed that the expressions of the voltage and current propagating at the arbitrary position x of the word line WL at the time t are e(x, t) and i(x, t), respectively.

Here, a theoretical delay time $t_{delay}$ for the voltage e(x, t) at the arbitrary position x on the word line WL to reach a voltage value $\beta \times E$ ($\beta$ is a real number satisfying $0<\beta<1$) is estimated.

First, assuming that the voltage and the current at the time t and the position x are e(x, t) and i(x, t), respectively, the voltage e(x, t) and the current i(x, t) are expressed by the following equations by using the basic equations of the distributed constant circuit.

[Equation 1]

$$-\frac{\partial e(x, t)}{\partial x} = Ri(x, t) \quad (1)$$

[Equation 2]

$$-\frac{\partial i(x, t)}{\partial x} = C\frac{\partial e(x, t)}{\partial t} \quad (2)$$

In addition, these equations can be transformed by using Laplace transform, and e(x, t) and the current i(x, t) while the pre-emphasis voltage is applied (t≤T) can be formulated as follows by using the condition that the current and the voltage are 0 at all positions x at time t=0 and the condition that the voltage at the near end (x=0) is $\alpha \times E$ and the current at the far end (x=1) is 0.

[Equation 3]

$$e(x, t) = \alpha E\left\{1 - \frac{4}{\pi}\sum_{k=0}^{\infty} \frac{1}{2k+1}\varepsilon^{-\frac{(2k+1)^2\pi^2}{4RCl^2}t}\sin\frac{(2k+1)\pi}{2l}x\right\} \quad (3)$$

[Equation 4]

$$i(x, t) = \frac{2\alpha E}{Rl}\sum_{k=0}^{\infty} e^{-\frac{(2k+1)^2\pi^2}{4RCl^2}t}\cos\frac{(2k+1)\pi}{2l}x \quad (4)$$

Then, the voltage e(x, t) after the application of the pre-emphasis voltage (t>T) can be formulated as follows by using Equations (3) and (4) of the voltage e(x, t) and the current i(x, t) obtained in this manner, equations obtained by Laplace transform of Equations (1) and (2), and the condition that the voltage at the near end (x=0) is E and the current at the far end (x=1) is 0 after the application of the pre-emphasis voltage (t>T).

[Equation 5]

$$e(x, t) = \quad (5)$$
$$E - \frac{4E}{\pi}\sum_{k=0}^{\infty}\left\{\alpha - (\alpha - 1)e^{\frac{(2k+1)^2}{\tau}T}\right\}\frac{1}{2k+1}e^{-\frac{(2k+1)^2}{\tau}t}\sin\frac{(2k+1)x\pi}{2l},$$
$$T < t$$

In the above Equation (5), $\tau$ is a constant expressed by $\tau = 4RCl^2/\pi^2$.

Using the theoretical equation of the voltage e(x, t) evaluated in this manner, the condition that the delay time $t_{delay}$ is minimized at the arbitrary position x on the word line WL will be considered. In the above Equation (5), it can be seen that the term of k=0, among the terms of k=0 to ∞, has the largest influence on the voltage value. Therefore, the minimum value of the delay time $t_{delay}$ is given by the period T and the coefficient $\alpha$ when the coefficient of the term becomes 0. From this condition, it is understood that the period $T=T_{opt}$ given by the following equation is a condition for giving the minimum delay time $t_{delay}$.

[Equation 6]

$$T_{opt} = \tau\ln\frac{\alpha}{\alpha - 1} \quad (6)$$

That is, the period $T_{opt}$ is the optimum pre-emphasis time. In addition, the minimum delay time $t_{delay\_min}$ at this time is given by the following equation by approximating the above Equation (5) and solving this for t and then substituting the above Equation (6) into T.

[Equation 7]

$$t_{delay\ min} \approx \frac{\tau}{9} \ln\left[\frac{4\alpha}{3\pi\beta}\left(\frac{\alpha}{\alpha-1}\right)^8\right] \quad (7)$$

Here, it is assumed that $\{\alpha/(\alpha-1)\}^8 \gg 1$ is satisfied within the practical range of $1 < \alpha$.

Thus, it has been clarified by the present inventors that, in order to obtain the minimum delay time $t_{delay\_min}$, the condition is to apply the drive voltage in which the pre-emphasis voltage is generated in the period T approximated to the period $T_{opt}$ given by the above Equation (6). In addition, the present inventors evaluated the theoretical value of the drive voltage at time $t=T_{opt}$. That is, by ignoring the terms other than the term of k=0 having little influence in Equation (3) and calculating the voltage at time $t=T_{opt}$ at the position x on the word line WL by approximating only the term of k=0, the following equation is obtained.

[Equation 8]

$$e(x, T_{opt}) = \alpha E\left(1 - \frac{4}{\pi}\frac{\alpha-1}{\alpha}\sin\frac{\pi}{2l}x\right) \equiv V_{det}(x) \quad (8)$$

From this equation, it has been clarified that a voltage $V_{det}(x)$ at the position x at the end of application of the optimum pre-emphasis voltage ($t=T_{opt}$) is determined regardless of the resistance R and the capacitance C, which are the circuit characteristic values of the word line WL. For example, the voltage $V_{det}(x=l)$ at the end of application of the pre-emphasis voltage at the far end of the word line WL is given by the following equation.

[Equation 9]

$$e(l, T_{opt}) = \alpha E\left(1 - \frac{4}{\pi}\frac{\alpha-1}{\alpha}\right) \equiv V_{det}(x=l) \quad (9)$$

The drive circuit 19 of the present embodiment has a function configured based on the analysis result of the propagation state of the drive voltage described above. Hereinafter, the details of the configuration of the drive circuit 19 will be described.

Figure 6:
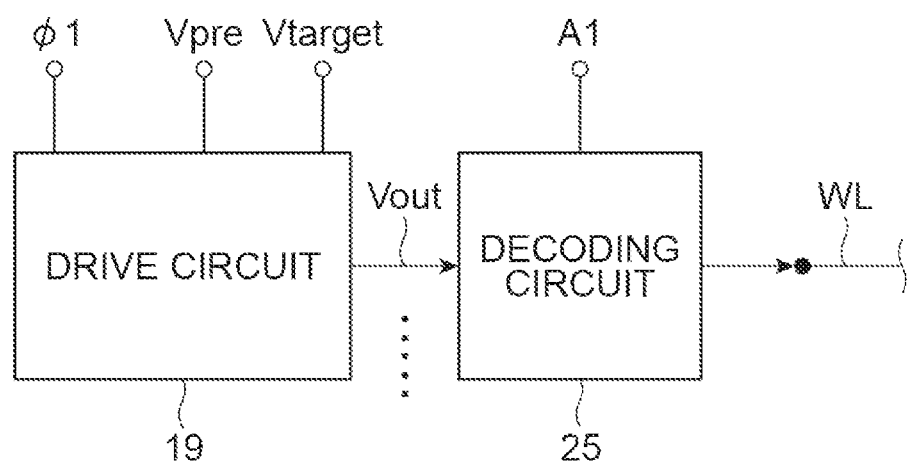
FIG. 6 is a diagram showing a connection configuration between the drive circuit 19 and the word line WL.

FIG. 6 shows a connection configuration between the drive circuit 19 and the word line WL. The drive circuit 19 is configured such that the output of the drive voltage Vout is electrically connected to each of the plurality of word lines WL corresponding to the plurality of sub-array portions 11a and the dummy sub-array portion 11b through a decoding circuit 25. Each decoding circuit 25 is a switching circuit that receives an address signal A1 from the control circuit 21 and switches so as to apply the drive voltage Vout to the memory cell MC indicated by the address signal. The decoding circuit 25 may be omitted when the drive voltage Vout having the same waveform is applied to all the sub-array portions 11a at the same time. A control signal φ1 for controlling the data read operation is input to the drive circuit 19 from the control circuit 21, and a power supply voltage Vpre for generating the pre-emphasis voltage and a power supply voltage Vtarget for generating the target voltage of the drive voltage are supplied from the outside.

Figure 7:
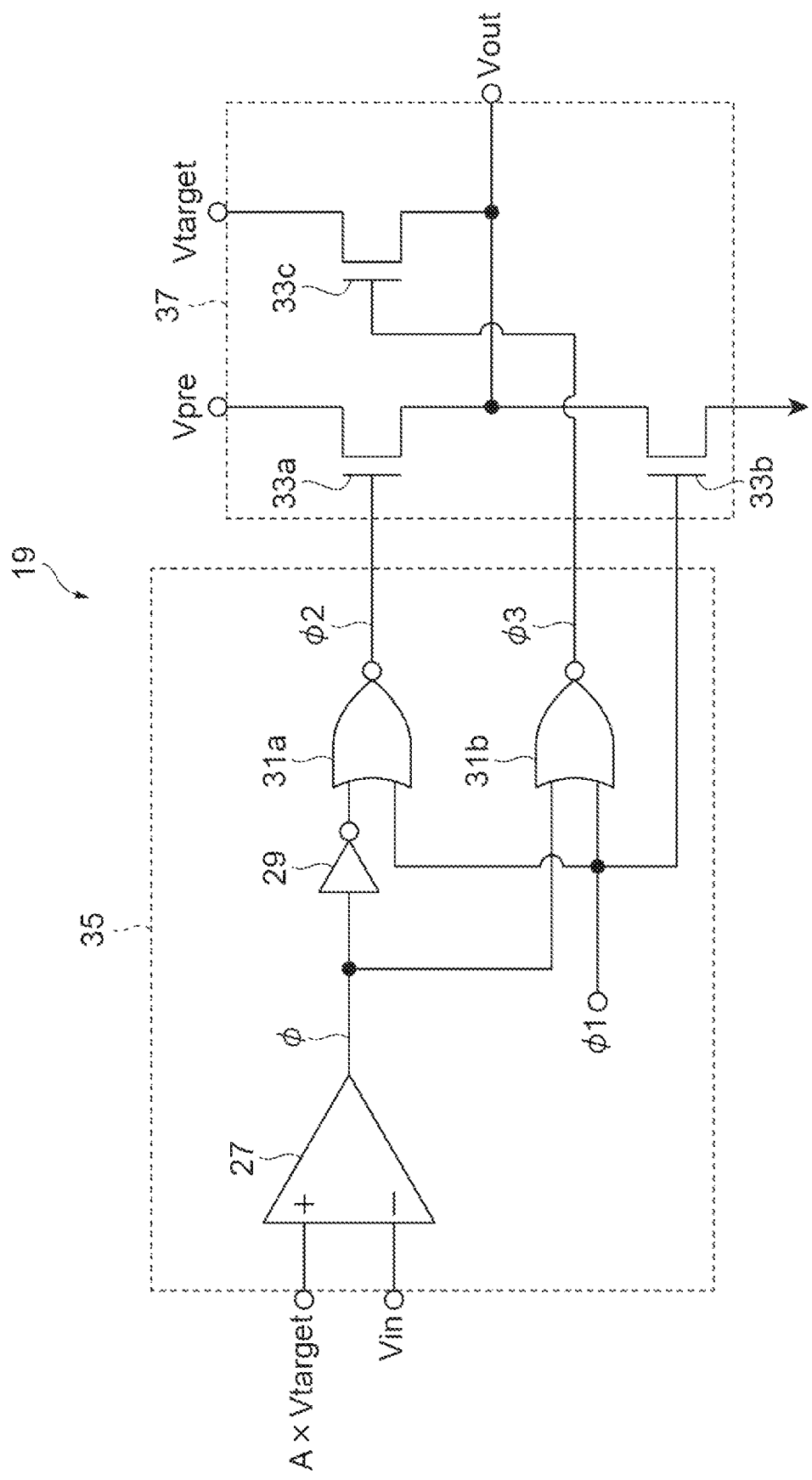
FIG. 7 is a circuit diagram showing the detailed configuration of the drive circuit 19.

FIG. 7 is a circuit diagram showing the detailed configuration of the drive circuit 19. In the drive circuit 19, an operational amplifier (comparator) 27, a NOT circuit 29, NOR circuits 31a and 31b, and MOS transistors (switches) 33a, 33b, and 33c are mounted as elements configuring the circuit. The operational amplifier 27, the NOT circuit 29, and the NOR circuits 31a and 31b configure a control unit 35 that sets the time width T of the pre-pulse in the drive voltage, and the MOS transistors 33a, 33b, and 33c configure a voltage application unit 37 that applies a drive voltage having a pre-pulse set by the control unit 35.

The operational amplifier 27 is configured such that an input voltage Vin indicating the voltage detection value of the word line WL output from the detection circuit 17 is input to its inverting input and a voltage corresponding to a voltage value A×Vtarget set in advance is input to its non-inverting input and a voltage difference between these voltages is amplified to output a pulse signal φ. Here, the Vtarget corresponds to the rising voltage value E (FIG. 4) of the drive voltage set in advance, and the coefficient A is a value calculated in advance by the following equation A=α−(4/π)×(α−1) based on the coefficient α corresponding to the pre-emphasis voltage set in the drive voltage.

The NOR circuit 31a is configured such that the pulse signal φ is input to one of the inputs through the NOT circuit 29 and a control signal φ1 is input to the other input. In addition, the NOR circuit 31b is configured such that the pulse signal φ is input to one of the inputs and the control signal φ1 is input to the other input.

The two MOS transistors 33a and 33b are connected in series with each other by connecting their current terminals, and the power supply voltage Vpre is applied to the current terminal (drain) of one MOS transistor 33a and a low voltage (for example, a ground voltage) is applied to the current terminal (source) of the other MOS transistor 33b. Then, a pulse signal φ2 generated by the NOR circuit 31a is input to the control terminal (gate) of the MOS transistor 33a, and the control signal φ1 is input to the control terminal (gate) of the MOS transistor 33b. In addition, similarly, the MOS transistor 33c is also directly connected to the MOS transistor 33b, and the power supply voltage Vtarget is applied to the current terminal (drain) of the MOS transistor 33a and a pulse signal φ3 generated by the NOR circuit 31b is input to the control terminal (gate) of the MOS transistor 33c. The connection points of the MOS transistors 33a, 33b, and 33c are electrically connected to the output terminal for outputting the drive voltage Vout.

With such a configuration, the control unit 35 has a function of setting the time width T by comparing the target value A×Vtarget of the voltage set in advance with the voltage detection value of the word line WL and controlling the pre-pulse in the drive voltage to be turned on/off according to the comparison result. In addition, the voltage application unit 37 has a switching function of turning on/off the pre-pulse according to the control by the control unit 35.

Figure 8:
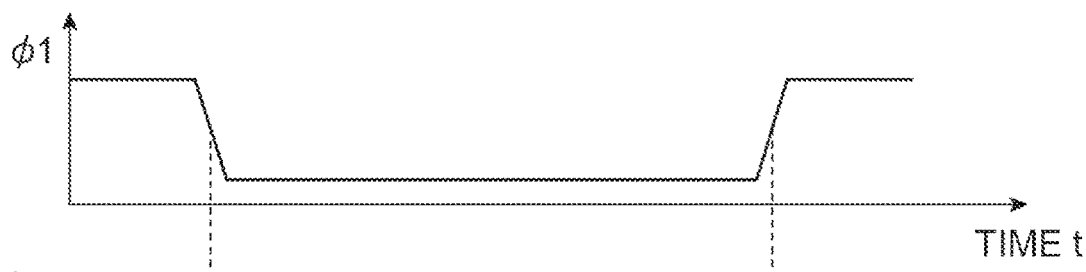
FIG. 8 is a diagram showing images of time waveforms of various signals processed by the drive circuit 19.
Figure 8:
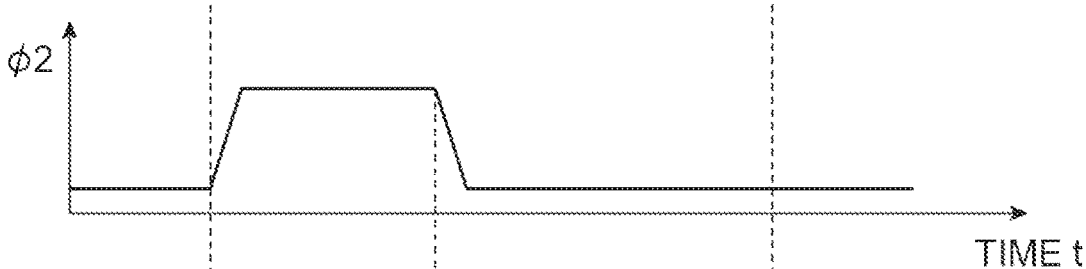
Figure 8:
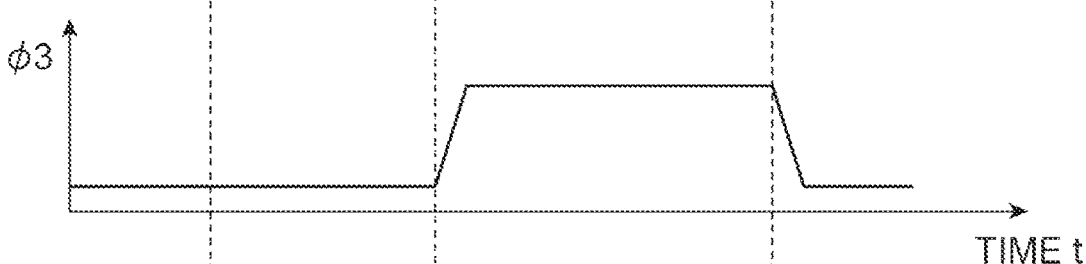
Figure 8:
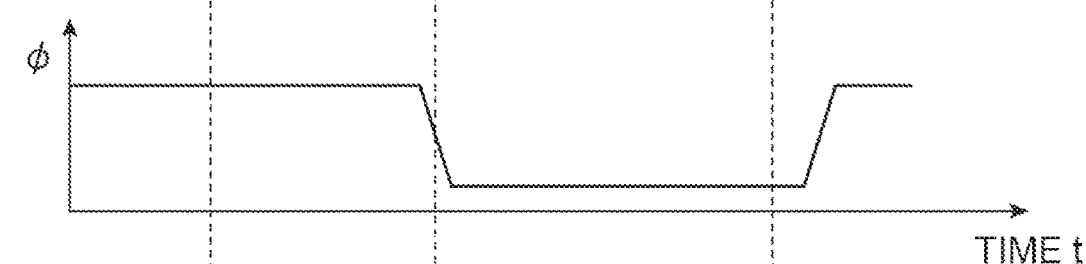
Figure 8:
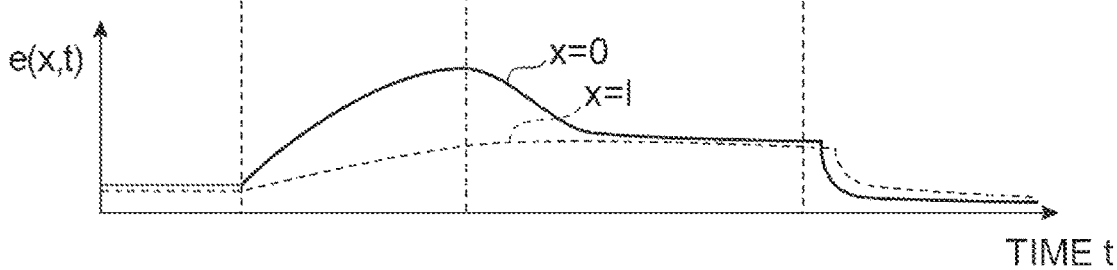

FIG. 8 shows images of time waveforms of various signals processed by the drive circuit 19 having the above-described configuration. The part (a) shows the waveform of the control signal φ1, the parts (b) to (d) show the waveforms of the pulse signals φ2, φ3, and φ, and the part (e) shows the waveform of the voltage e(x, t) in the word line WL.

The control signal φ1 is switched from high to low at the timing when the address of the memory cell MC whose data is to be read is determined. At this timing, the drive voltage applied to the word line WL does not rise and the input voltage Vin is at a low level, so that the pulse signal ϕ is at a high level. At the same time, the pulse signal ϕ2 output from the NOR circuit 31a rises from low to high, while the pulse signal ϕ3 output from the NOR circuit 31b maintains a low level. Therefore, in the drive voltage Vout that appears at the output terminal at this time, a waveform that rises stepwise at the pre-emphasis voltage defined by the power supply voltage Vpre is set. With the passage of time thereafter, the voltage e(x, t) generated in the word line WL gradually rises.

Thereafter, a voltage e(1, t) at the far end (x=1) of the word line WL rises, and at the timing when the value exceeds A×Vtarget, the pulse signal ϕ drops from high to low. In response to this, the pulse signal ϕ2 drops from high to low, and at the same time, the pulse signal ϕ3 rises from low to high. Therefore, in the drive voltage Vout that appears at the output terminal at this time, a waveform that drops to the target voltage of the drive voltage defined by the power supply voltage Vtarget is set. By such an operation of the drive circuit 19, at the timing when a voltage approximated to the voltage $V_{det}(x=1)$ calculated by the above Equation (9) is detected in the word line WL, control is realized in which the pre-emphasis voltage is turned off and switched to the target voltage.

In addition, the control signal ϕ1 is switched from low to high at the timing when the process of reading data from the target memory cell MC ends. In response to this, the pulse signal ϕ3 output from the NOR circuit 31b drops from high to low, while the pulse signal ϕ2 output from the NOR circuit 31a maintains a low level. Therefore, the drive voltage Vout appearing at the output terminal is set to drop to a low voltage (for example, the ground voltage). As a result, the voltage e(x, t) generated in the word line WL also gradually drops to a low voltage, and the pulse signal ϕ also transitions from low to high accordingly.

The operation and effect of the NAND flash memory 1 of the above embodiment will be described.

According to the NAND flash memory 1 described above, a voltage value at the end of the word line WL is detected, the time width of the pre-pulse is set according to the voltage value, and a drive voltage in which a pre-pulse having the time width T that approximates the optimum time width $T_{opt}$ to realize the shortest propagation delay time is set is applied to the word line WL. Therefore, since the time width T of the pre-pulse is automatically set according to the detected voltage value of the word line WL, the calibration of the drive voltage can be automated and speeded up. As a result, the test for calibrating the drive voltage becomes unnecessary, and the test cost and the test time can be reduced. In addition, the drive circuit 19 of the NAND flash memory 1 has a function of comparing the target value, set in advance based on the target voltage value of the drive voltage and the amplitude value of the pre-pulse, with the detected voltage value and turning on/off the pre-pulse in the drive voltage according to the comparison result. With such a function, it is possible to further automate and speed up the calibration of the drive voltage, and it is possible to realize high-speed reading of data from the memory cell by optimizing the propagation delay time of the drive voltage in the word line WL.

In particular, the drive circuit 19 of the NAND flash memory 1 calibrates the drive voltage by detecting the voltage value at the far end of the word line WL. With such a configuration, it is possible to shorten the delay time of the drive voltage in all of the plurality of cells connected to the word line WL, and accordingly, it is possible to drive all of the plurality of cells at high speed.

In addition, in the NAND flash memory 1, since the time width of the pre-pulse is set by detecting the voltage value of the word line WL corresponding to the dummy sub-array portion 11b configured on the same device as the sub-array portion 11a, it becomes easy to optimize the calibration of the drive voltage.

Figure 9:
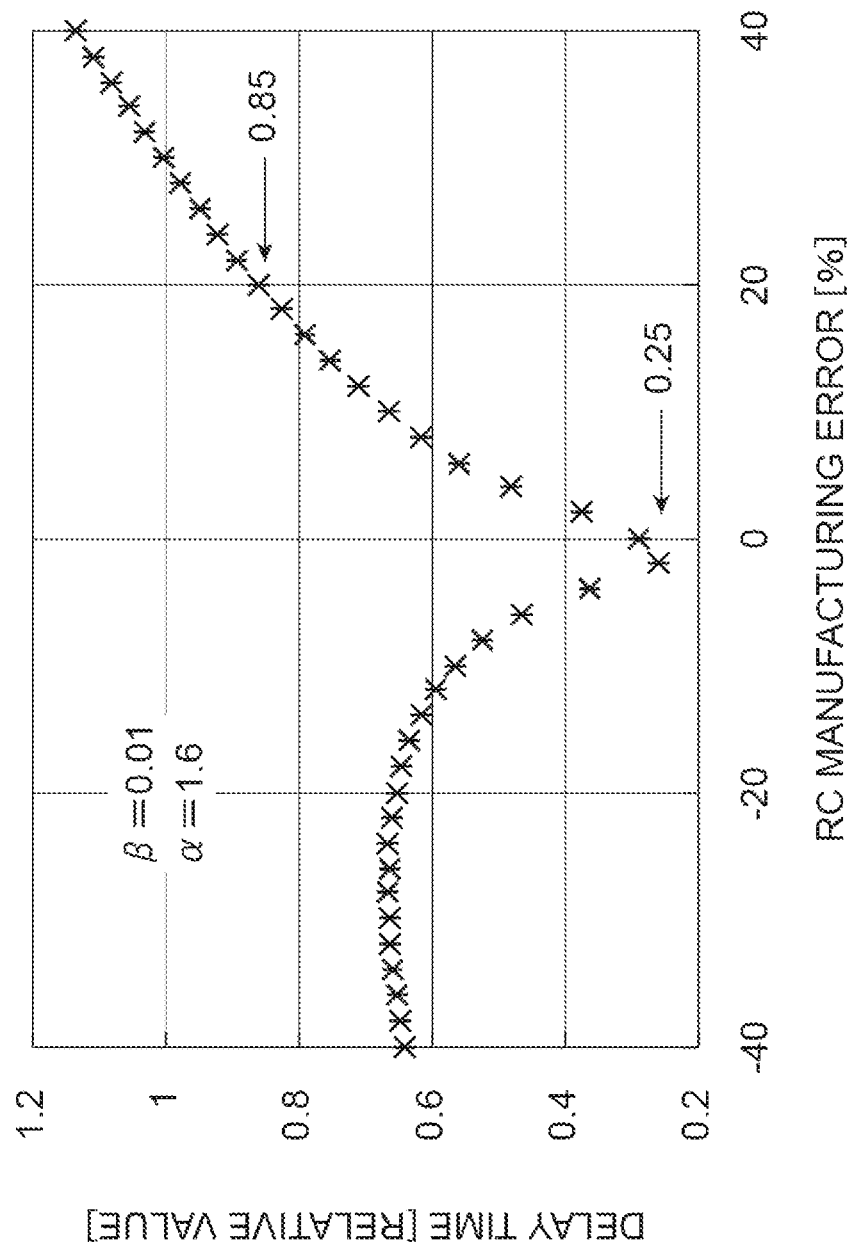
FIG. 9 is a graph showing the relationship between the manufacturing error of a device and the delay time of a voltage propagating through the word line WL in the present embodiment.

Here, the effect of the present embodiment will be described based on theoretical calculation. FIG. 9 shows a theoretical calculation result of the relationship between the manufacturing error of a device and the delay time of a voltage propagating through the word line WL when the calibration of the time width T of the pre-pulse is stopped in the present embodiment. In this theoretical calculation, the real number α=1.6, the real number β=0.01, and the delay time is calculated as a relative value when a value in a case where pre-emphasis is not used is 1. Thus, when the calibration is stopped, even if the time width T is set based on the resistance R and the capacitance C that are manufacturing target values of the characteristic values of the word line WL, the delay time deteriorates from 0.25 to 0.85 in relative value when a 20% R×C manufacturing error occurs. On the other hand, according to the present embodiment, it is possible to keep the delay time close to the minimum value by calibration even if a manufacturing error occurs. For example, even if a 20% R×C manufacturing error occurs, the effect of shortening the delay time as compared with a case where pre-emphasis is not used can be increased from a 30% reduction to a 75% reduction.

Figure 10:
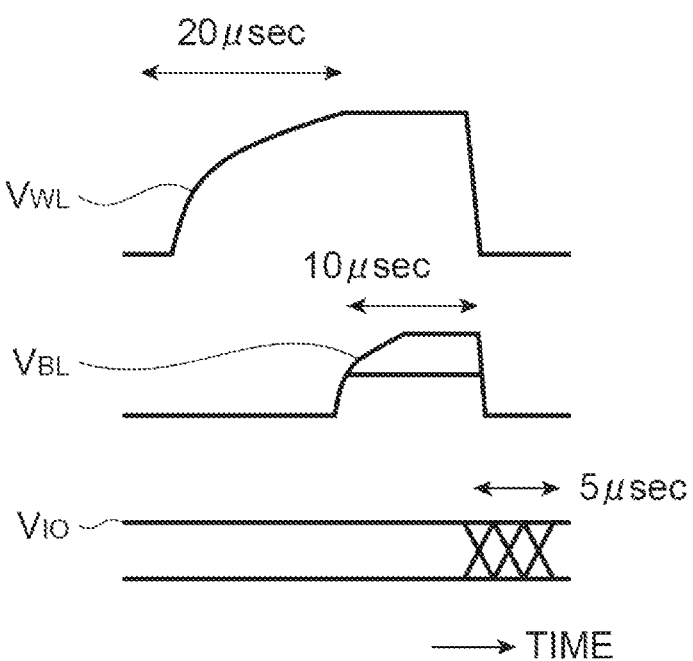
FIG. 10 is a diagram showing voltage waveforms propagating through the word line WL and a bit line BL and a waveform of an output signal output at the time of data reading in the NAND flash memory 1.

FIG. 10 shows examples of voltage waveforms $V_{WL}$ and $V_{BL}$ propagating through the word line WL and the bit line BL and a waveform $V_{IO}$ of an output signal output at the time of data reading in the NAND flash memory 1 of the present embodiment. Thus, the total delay time from the start of data reading to the output of the read data in the output signal is a time (for example, 35 μsec) obtained by adding the delay time for the voltage waveform $V_{WL}$ to rise (for example, 20 μsec), the delay time for the voltage waveform $V_{BL}$ to rise (for example, 10 μsec), and the delay time of the output waveform $V_{IO}$ (for example, 5 μsec), and half or more of the total delay time is the delay time in the word line WL. From this, it can be seen that the speed of data output can be effectively increased by shortening the propagation delay time of the drive voltage according to the present embodiment.

The present invention is not limited to the embodiment described above. The configuration of the embodiment described above can be changed in various ways.

For example, an electronic device to which the configuration of the present embodiment is applied is not limited to the NAND flash memory, and any electronic device for driving cells, such as semiconductor elements or pixels arranged in rows, by linear wiring portions may be applied. As examples of such an electronic device, a 3D cross-point memory, a CMOS image sensor, a touch panel display, and a flat panel display such as a liquid crystal display (LCD) can be mentioned.

Figure 11:
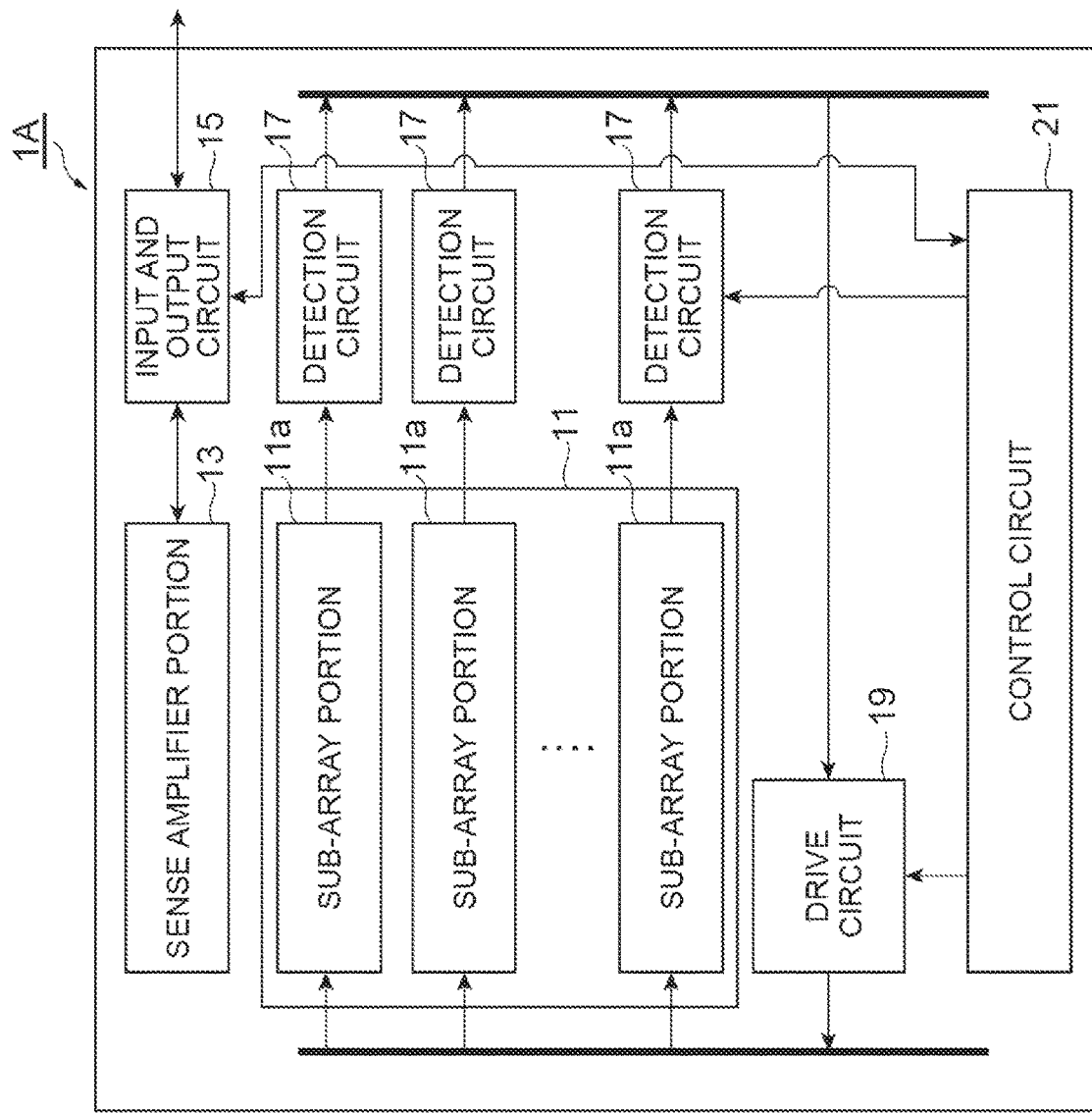
FIG. 11 is a block diagram showing the overall configuration of a NAND flash memory 1A according to a modification example.

In addition, FIG. 11 shows the configuration of a NAND flash memory 1A according to a modification example. In this modification example, the dummy sub-array portion 11b is removed from the memory array 11, the detection circuit 17 is provided for each of the plurality of sub-array portions 11a, and a voltage at the far end of each word line WL corresponding to the plurality of sub-array portions 11a is detected. In addition, when reading data, the control circuit 21 controls the drive circuit 19 to calibrate the time width of the drive voltage according to the voltage of the word line WL detected by the detection circuit 17 and applies the drive voltage for each sub-array portion 11a. According to such a configuration, since the time width of the drive voltage is calibrated according to the voltage of the word line WL for each sub-array portion 11a, it is possible to control the time width more accurately.

In addition, in the modification example shown in FIG. 11, it is not necessary to provide the detection circuit 17 for each of all the sub-array portions 11a. For example, the detection circuit 17 may be provided only for one representative sub-array portion 11a, and the control circuit 21 may control the drive circuit 19 to calibrate the time width of the drive voltage, which is applied to the word lines WL corresponding to all the sub-array portions 11a, according to the voltage detected by the detection circuit 17 for the word line WL corresponding to the one representative sub-array portion 11a. Alternatively, one detection circuit 17 may be provided for each of the plurality of sub-array portions 11a, and a plurality of similar detection circuits 17 may be provided.

In addition, the above-described embodiment and modification example are not limited to storing binary (1-bit) data in the memory cell, and may operate so as to store multi-value (2-bit or more) data. In addition, the above-described embodiment and modification example are not limited to using the drive voltage that rises stepwise as a drive voltage, and may be configured to apply a drive voltage that drops stepwise as a drive voltage.

Figure 12:
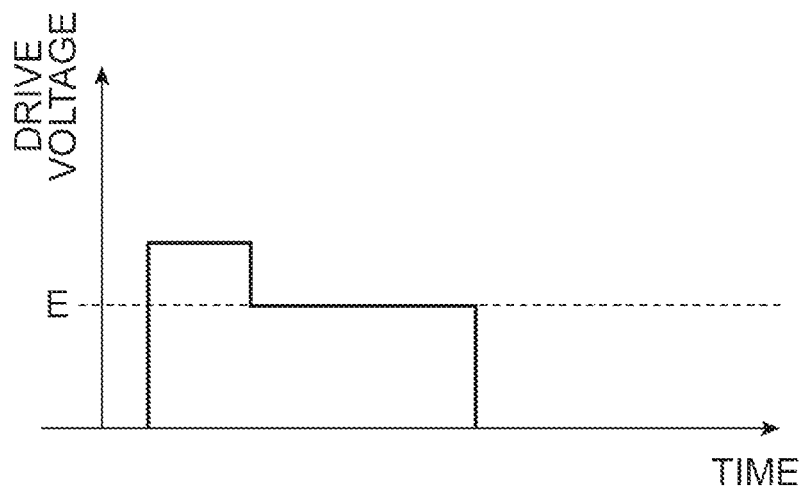
FIG. 12 is a diagram showing waveforms of drive voltages generated in the embodiment and the modification example.
Figure 12:
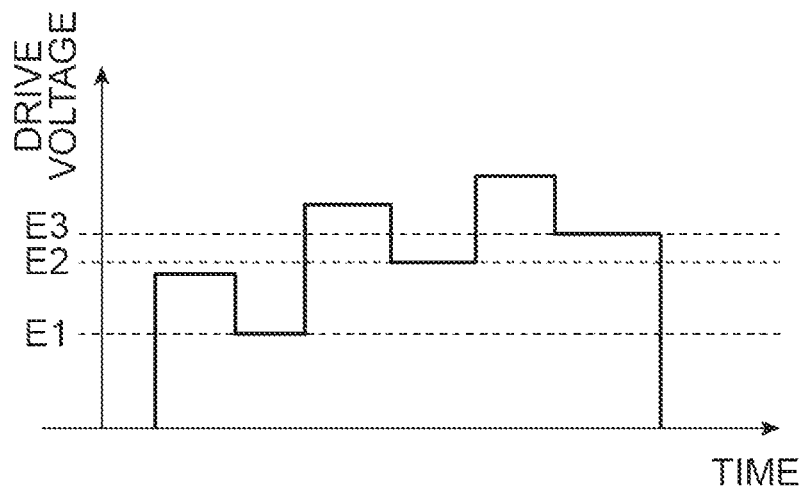
Figure 12:
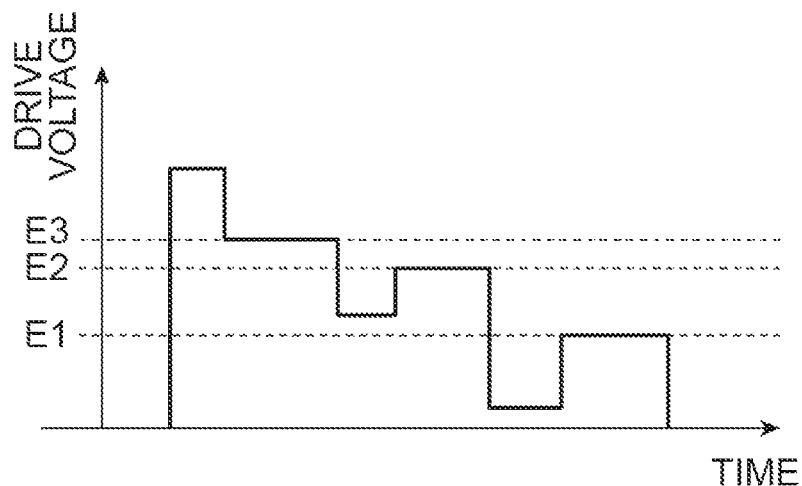

A part (a) of FIG. 12 shows the waveform of the drive voltage when 1-bit data is stored, a part (b) of FIG. 12 shows the waveform of the drive voltage when 2-bit data is stored, and a part (c) of FIG. 12 shows the waveform of the drive voltage that drops stepwise. Thus, when reading 1-bit data, a waveform in which a pre-pulse is set is used for the voltage signal that rises to the voltage value E, and when reading 2-bit data, a drive voltage is used which rises sequentially to a plurality of voltage values E1, E2, and E3 (E1<E2<E3) in a stepwise manner in multiple steps and in which a pre-pulse is set at a plurality of timings synchronized with (corresponding to) each rising timing. In addition, when reading 2-bit data, a drive voltage may be used which rises to the voltage value E3 in a stepwise manner first and then gradually drops sequentially to the voltage values E2 and E1 in a stepwise manner in multiple steps (E1<E2<E3). At this time, a pre-pulse having a high amplitude value is set first in the positive voltage direction with respect to the rising width in synchronization with the timing of rising to the voltage E3 (overdrive), and then a pre-pulse having a high amplitude value is set in the negative direction with respect to the falling width in synchronization with the respective timings of dropping to the voltages E2 and E1 (underdrive). Even in these cases, the time width of each pre-pulse is sequentially calibrated based on the detection voltage of the word line WL.

In addition, in the embodiment described above, the drive circuit 19 generates a drive voltage so as to be set to the time width $T_{opt}$ shown in the above Equation (6), but the time width $T_{opt}$ is not limited to the value shown in the above Equation (6).

That is, it is possible to set the drive voltage to the time width $T_{opt}$ also in consideration of the terms when k is 1 or more in the above Equation (5). For example, if the terms of k=2 or more are ignored in the above Equation (5), the following equation is obtained.

[Equation 10]

$$\frac{e(x,t)}{E} = 1 - \frac{4}{\pi}\left\{\alpha - (\alpha-1)e^{\frac{T-t}{\tau}}\right\}\sin\frac{\pi}{2l}x - \frac{4}{\pi}\left\{\alpha - (\alpha-1)e^{\frac{9(T-t)}{\tau}}\right\}\frac{1}{3}\sin\frac{3\pi}{2l}x \quad (10)$$

In the above Equation (10), T that minimizes the time t at which the second and third terms are 0 can be considered as the optimum time width $T_{opt}$. Using such a theory, for example, in order to minimize the delay time at the voltage at the far end of the word line WL, the drive circuit 19 sets the drive voltage to the time width $T_{opt}$ that minimizes t satisfying the following equation.

[Equation 11]

$$\left\{\alpha - (\alpha-1)e^{\frac{T-t}{\tau}}\right\} - \frac{1}{3}\left\{\alpha - (\alpha-1)e^{\frac{9(T-t)}{\tau}}\right\} = 0 \quad (11)$$

In addition, in the embodiment described above, the drive circuit 19 generates a drive voltage so that the pre-pulse is turned off when the detection voltage at the far end of the word line WL reaches the voltage $V_{det}$ shown in the above Equation (9), but the voltage $V_{det}$ is not limited to the value shown in the above Equation (9).

That is, it is possible to set the voltage value $V_{det}$ also in consideration of the terms when k is 1 or more in the above Equation (3). For example, if the terms of k=2 or more are ignored in the above Equation (3), the following equation is obtained.

[Equation 12]

$$e(x,t) = \alpha E\left[1 - \frac{4}{\pi}\left\{e^{-\frac{t}{\tau}}\sin\left(\frac{\pi}{2l}x\right) + \frac{1}{3}e^{-\frac{9t}{\tau}}\sin\left(\frac{3\pi}{2l}x\right)\right\}\right] \quad (12)$$

By substituting the value of Equation (6) into the above Equation (12), the voltage at time $t=T_{opt}$ at the arbitrary position x of the word line WL can be calculated by the following equation.

[Equation 13]

$$e(x, T_{opt}) = \alpha E\left[1 - \frac{4}{\pi}\left\{\frac{\alpha-1}{\alpha}\sin\left(\frac{\pi}{2l}x\right) + \frac{1}{3}\left(\frac{\alpha-1}{\alpha}\right)^9\sin\left(\frac{3\pi}{2l}x\right)\right\}\right] \equiv V_{det}(x) \quad (13)$$

Therefore, the drive circuit 19 can set the drive voltage to the optimum time width $T_{opt}$ by generating the drive voltage so that the pre-pulse is turned off when the detection voltage at the far end of the word line WL reaches the voltage $V_{det}$ shown in the above Equation (13).

In addition, in the above embodiment and the above modification example, a voltage at the far end of the word line WL is detected and the time width of the pre-pulse is set according to the voltage, but the location of the word line WL to be detected may be an arbitrary position x. That is, control may be performed so as to turn off the pre-pulse by comparing the voltage value $V_{det}(x)$ at the arbitrary position x shown in the above Equation (8) or the above Equation

(13) with the detected voltage value. For example, when the detection voltage at the midpoint x=½ of the word line WL is used, an operation may be performed so as to make a comparison with the voltage value $V_{det}(x=½)$ shown in the following equation.

[Equation 14]

$$e\left(\frac{l}{2}, T_{opt}\right) = \alpha E\left(1 - \frac{4}{\pi}\frac{1}{\sqrt{2}}\frac{\alpha-1}{\alpha}\right) \equiv V_{det}\left(x = \frac{l}{2}\right) \quad (14)$$

In addition, in the above embodiment and the above modification example, during the data reading processing, the drive circuit 19 may generate a drive voltage by superimposing a pre-pulse, which rises to the amplitude value (α×E−E) at the timing synchronized with the rising of the voltage signal, on a voltage signal that changes stepwise by the predetermined voltage value E.

In addition, in the above embodiment and the above modification example, the drive circuit 19 generates a drive voltage so that the pre-pulse is turned off when the detection voltage at the far end of the word line WL reaches the voltage $V_{det}$ shown in the above Equation (9), but the voltage $V_{det}$ may be set to a different set value depending on the model of the word line WL.

Figure 13:
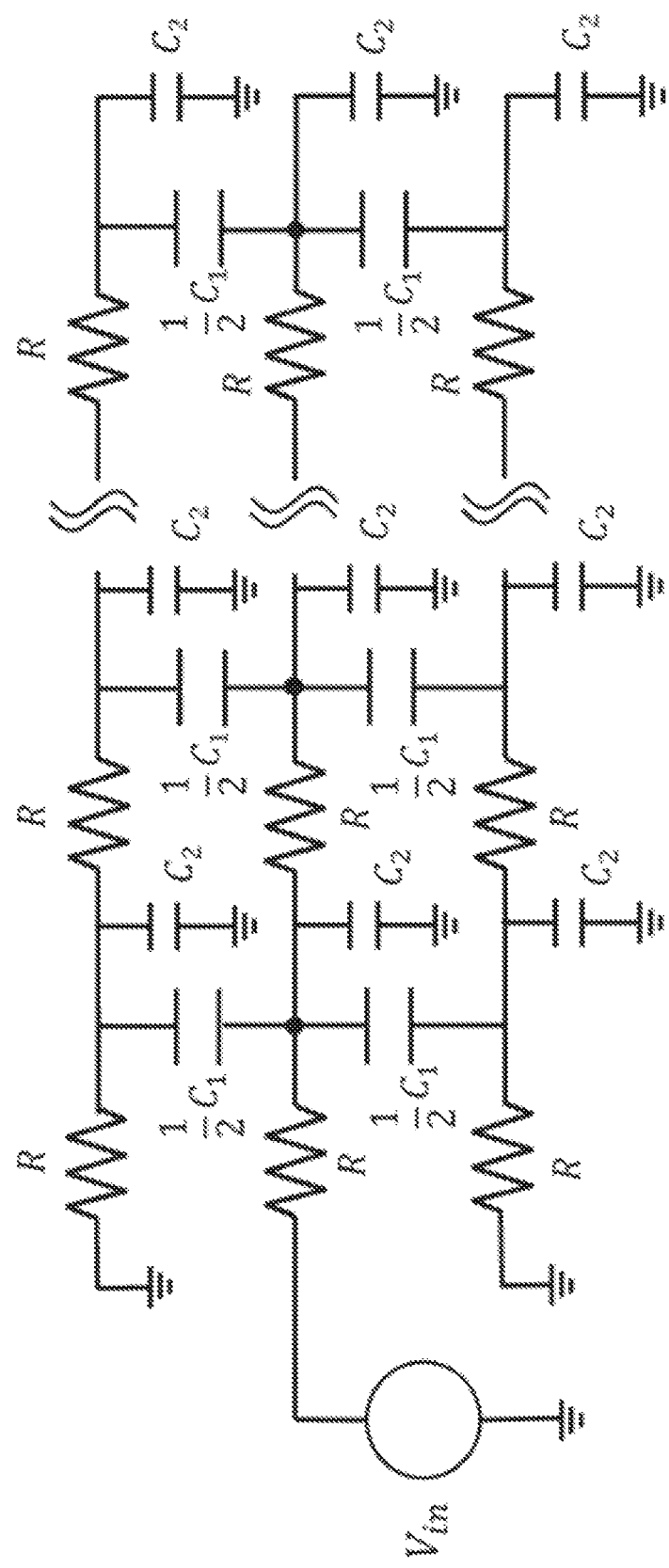
FIG. 13 is another equivalent circuit diagram of the word line WL.
Figure 14:
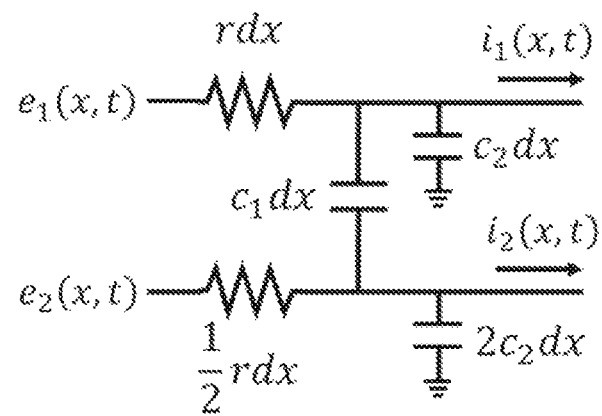
FIG. 14 is a diagram in which the equivalent circuit shown in FIG. 13 is replaced with a distributed constant circuit.

For example, when the distance between adjacent wiring lines in the word WL line is relatively short, the word line WL can be considered as a circuit shown in FIG. 13 that has a capacitance $C_1$ between adjacent wiring lines and a capacitance $C_2$ between wiring lines and a substrate on which the wiring lines are mounted, and this circuit can be replaced with a distributed constant circuit shown in FIG. 14. Assuming that the voltages and currents of two adjacent wiring lines are $e_1(x, t)$, $e_2(x, t)$, $i_1(x, t)$, and $i_2(x, t)$, the following Equations (15) to (18) are derived.

[Equation 15]

$$-\frac{\partial e_1(x, t)}{\partial x} = r i_1(x, t) \quad (15)$$

[Equation 16]

$$-\frac{\partial e_2(x, t)}{\partial x} = \frac{1}{2} r i_2(x, t) \quad (16)$$

[Equation 17]

$$-\frac{\partial i_1(x, t)}{\partial x} = c_1 \frac{\partial |e_1(x, t) - e_2(x, t)|}{\partial t} + c_2 \frac{\partial e_1(x, t)}{\partial t} \quad (17)$$

[Equation 18]

$$-\frac{\partial i_2(x, t)}{\partial x} = -c_1 \frac{\partial |e_1(x, t) - e_2(x, t)|}{\partial t} + 2c_2 \frac{\partial e_2(x, t)}{\partial t} \quad (18)$$

By solving the above equations, the voltage $e_1(t)$ is formulated as the following Equations (19) and (20).

[Equation 19]

$$e_1(x, t) = \alpha E - \frac{8\alpha E}{3\pi}\sum_{k=0}^{\infty}\frac{1}{2k+1}e^{-\frac{(2k+1)^2\pi^2}{4r(15c_1+c_2)l^2}t}\sin\frac{(2k+1)\pi}{2l}x - \frac{4\alpha E}{3\pi}\sum_{k=0}^{\infty}\frac{1}{2k+1}e^{-\frac{(2k+1)^2\pi^2}{4rc_2l^2}t}\sin\frac{(2k+1)\pi}{2l}x, \; t \leq T \quad (19)$$

[Equation 20]

$$e_1(x, t) = \quad (20)$$
$$E - \frac{2}{3}\frac{4E}{\pi}\sum_{k=0}^{\infty}\left\{\alpha - (\alpha-1)e^{\frac{(2k+1)^2\pi^2}{4r(15c_1+c_2)l^2}T}\right\}\frac{1}{2k+1}e^{-\frac{(2k+1)^2\pi^2}{4r(1.5c_1+c_2)l^2}t}$$
$$\sin\frac{(2k+1)\pi}{2l}x - \frac{1}{3}\frac{4E}{\pi}$$
$$\sum_{k=0}^{\infty}\left\{\alpha - (\alpha-1)e^{\frac{(2k+1)^2\pi^2}{4rc_2l^2}T}\right\}\frac{1}{2k+1}e^{-\frac{(2k+1)^2\pi^2}{4rc_2l^2}t}\sin\frac{(2k+1)\pi}{2l}x, t>T$$

By using the above equations, a voltage ratio A with respect to the voltage value $V_{det}(x)$ at the far end of the word line WL when β=0.01 can be calculated as shown in the following table. The table below shows the relationship between the capacitance ratio $C_1/C_2$ and the voltage ratio A (β=0.01), and values of the voltage ratio A to be set for values of the capacitance ratio $C_1/C_2$=0, ⅛, . . . , ∞ when the amplification factor α of the pre-pulse is set to α=1.1, 1.2, . . . , 2 are shown in each column. That is, the optimum pre-pulse is set by setting the voltage value $V_{det}(x)$ having the voltage ratio A with respect to the voltage value E determined according to the capacitance ratio $C_1/C_2$. At this time, the voltage value $V_{det}(x)$ is not determined by the magnitudes of the resistance value R, the capacitance values $C_1$ and $C_2$, but is determined only by the capacitance ratio $C_1/C_2$. The optimum value of the voltage ratio A is derived by numerical calculation based on the above Equations (19) and (20). The values when the capacitance ratio $C_1/C_2$ is 0 and ∞ are calculated based on the derived equation.

TABLE 1

| | | A | | | | | | | | | |
|---|---|---|---|---|---|---|---|---|---|---|---|
| | α | 1.1 | 1.2 | 1.3 | 1.4 | 1.5 | 1.6 | 1.7 | 1.8 | 1.9 | 2 |
| $C_1/C_2$ | ∞ | 1.015 | 1.030 | 1.045 | 1.060 | 1.076 | 1.091 | 1.106 | 1.121 | 1.136 | 1.151 |
| | 8 | 1.005 | 1.021 | 1.038 | 1.054 | 1.069 | 1.085 | 1.100 | 1.116 | 1.132 | 1.147 |
| | 4 | 0.998 | 1.011 | 1.024 | 1.038 | 1.053 | 1.067 | 1.080 | 1.094 | 1.107 | 1.119 |
| | 2 | 0.990 | 1.000 | 1.010 | 1.019 | 1.028 | 1.034 | 1.039 | 1.043 | 1.045 | 1.045 |
| | 1 | 0.979 | 0.976 | 0.973 | 0.968 | 0.960 | 0.951 | 0.941 | 0.928 | 0.915 | 0.900 |
| | ½ | 0.966 | 0.951 | 0.929 | 0.906 | 0.884 | 0.863 | 0.840 | 0.817 | 0.795 | 0.765 |
| | ¼ | 0.973 | 0.946 | 0.922 | 0.895 | 0.869 | 0.843 | 0.816 | 0.790 | 0.764 | 0.738 |
| | ⅛ | 0.972 | 0.946 | 0.919 | 0.891 | 0.865 | 0.838 | 0.811 | 0.784 | 0.757 | 0.731 |
| | 0 | 0.973 | 0.945 | 0.918 | 0.891 | 0.863 | 0.836 | 0.809 | 0.781 | 0.754 | 0.727 |

Here, in the embodiment described above, it is preferable that the control unit sets the time width by comparing the target value set in advance with the voltage value and turning on/off the pre-pulse according to the comparison result. In this case, it is possible to further speed up the calibration of the drive voltage.

In addition, it is also preferable that the target value is set in advance based on the predetermined voltage value and the predetermined amplitude value. In addition, it is also preferable that the target value is a value determined by the capacitance between adjacent wiring lines in the wiring portion and the capacitance between the wiring portion and the substrate on which the wiring portion is mounted. In this case, it is possible to optimize the propagation delay time of the drive voltage in the wiring portion.

In addition, it is also preferable that the control unit has a comparator for comparing the target value with the voltage value and the voltage application unit has a switch for turning on/off the pre-pulse according to the output of the comparator. In this manner, it is possible to speed up the calibration of the drive voltage with a simple configuration.

In addition, it is also preferable that the control unit detects a voltage value at the end of the wiring portion. In this case, it is possible to shorten the delay time of the drive voltage in all of the plurality of cells connected to the wiring portion, and accordingly, it is possible to drive all of the plurality of cells at high speed.

In addition, it is also preferable that the voltage application unit generates a drive voltage in which a pre-pulse is set at a plurality of timings corresponding to the rising or falling of the voltage signal changing stepwise in multiple steps. In this case, all of the plurality of cells driven by the drive voltage having voltage values of a plurality of steps can be driven at high speed.

Here, it is preferable that the electronic device of the above embodiment includes a dummy array portion in which a plurality of dummy cells are arranged and one or more array portions in which a plurality of cells are arranged and that the control unit detects the voltage value of a wiring portion corresponding to the dummy array portion and sets the time width of the pre-pulse of the drive voltage, which is to be applied to the wiring portion corresponding to one or more array portions, according to the detected voltage value. With such a configuration, the time width of the pre-pulse is set by detecting the voltage value of the wiring portion corresponding to the dummy array portion configured on the same device as the array portion, so that it becomes easy to optimize the calibration of the drive voltage.

In addition, it is also preferable that one or more array portions in which a plurality of cells are arranged are provided and that the control unit detects the voltage value of a wiring portion corresponding to any one of the one or more array portions and sets the time width of the pre-pulse of the drive voltage, which is to be applied to the wiring portion corresponding to each of the one or more array portions, according to the detected voltage value. With such a configuration, the time width of the pre-pulse is set by detecting the voltage value of the wiring portion corresponding to any one of the one or more array portions configured on the same device, so that it becomes easy to optimize the calibration of the drive voltage.

INDUSTRIAL APPLICABILITY

One aspect of the present invention is to reduce the test cost and the test time by using a drive circuit and an electronic device for driving a plurality of cells.

REFERENCE SIGNS LIST 1, 1A: NAND flash memory, 17: detection circuit, 19: drive circuit, 21: control circuit, 27: operational amplifier (comparator), 33a, 33b, 33c: MOS transistor (switch), 35: control unit, 37: voltage application unit, MC: memory cell, WL: word line.

The invention claimed is:
1. A drive circuit for driving a plurality of linearly arranged cells through a linear wiring portion connected to the plurality of cells, comprising:
   a voltage application circuit configured to generate a drive voltage in which a pre-pulse having a predetermined amplitude value is set at a timing corresponding to rising or falling of a voltage signal changing stepwise by a predetermined voltage value, and apply the drive voltage to the wiring portion; and
   a controller configured to detect a voltage value at a predetermined position of the wiring portion and set a time width of the pre-pulse according to the detected voltage value,
   wherein the controller sets the time width by comparing a target value set in advance with the voltage value and turning on/off the pre-pulse according to a result of the comparison, and
   the target value is set in advance based on the predetermined voltage value and the predetermined amplitude value.
2. The drive circuit according to claim 1,
   wherein the controller has a comparator for comparing the target value with the voltage value, and
   the voltage application circuit has a switch for turning on/off the pre-pulse according to an output of the comparator.
3. The drive circuit according to claim 1,
   wherein the controller detects a voltage value at an end of the wiring portion.
4. The drive circuit according to claim 1,
   wherein the voltage application circuit generates a drive voltage in which the pre-pulse is set at a plurality of timings corresponding to rising or falling of a voltage signal changing stepwise in multiple steps.
5. An electronic device, comprising:
   the drive circuit according to claim 1; and
   the plurality of cells.
6. The electronic device according to claim 5, further comprising:
   a dummy array portion in which a plurality of dummy cells are arranged; and
   one or more array portions in which the plurality of cells are arranged,
   wherein the controller detects a voltage value of the wiring portion corresponding to the dummy array portion and sets a time width of the pre-pulse of the drive voltage, which is to be applied to the wiring portion corresponding to the one or more array portions, according to the detected voltage value.
7. The electronic device according to claim 5, further comprising:

one or more array portions in which the plurality of cells are arranged, wherein the controller detects a voltage value of the wiring portion corresponding to any one of the one or more array portions and sets a time width of the pre-pulse of the drive voltage, which is to be applied to the wiring portion corresponding to each of the one or more array portions, according to the detected voltage value.

8. A drive circuit for driving a plurality of linearly arranged cells through a linear wiring portion connected to the plurality of cells, comprising:

a voltage application circuit configured to generate a drive voltage in which a pre-pulse having a predetermined amplitude value is set at a timing corresponding to rising or falling of a voltage signal changing stepwise by a predetermined voltage value, and apply the drive voltage to the wiring portion; and a controller configured to detect a voltage value at a predetermined position of the wiring portion and set a time width of the pre-pulse according to the detected voltage value, wherein the controller sets the time width by comparing a target value set in advance with the voltage value and turning on/off the pre-pulse according to a result of the comparison, and the target value is a value determined by a capacitance between adjacent wiring lines in the wiring portion and a capacitance between the wiring portion and a substrate on which the wiring portion is mounted.

9. The drive circuit according to claim 8, wherein the controller has a comparator for comparing the target value with the voltage value, and the voltage application circuit has a switch for turning on/off the pre-pulse according to an output of the comparator.

10. The drive circuit according to any one of claim 8, wherein the controller detects a voltage value at an end of the wiring portion.

11. The drive circuit according to claim 8, wherein the voltage application circuit generates a drive voltage in which the pre-pulse is set at a plurality of timings corresponding to rising or falling of a voltage signal changing stepwise in multiple steps.

12. An electronic device, comprising:

the drive circuit according to claim 8; and the plurality of cells.

13. The electronic device according to claim 12, further comprising:

a dummy array portion in which a plurality of dummy cells are arranged; and one or more array portions in which the plurality of cells are arranged, wherein the controller detects a voltage value of the wiring portion corresponding to the dummy array portion and sets a time width of the pre-pulse of the drive voltage, which is to be applied to the wiring portion corresponding to the one or more array portions, according to the detected voltage value.

14. The electronic device according to claim 12, further comprising:

one or more array portions in which the plurality of cells are arranged, wherein the controller detects a voltage value of the wiring portion corresponding to any one of the one or more array portions and sets a time width of the pre-pulse of the drive voltage, which is to be applied to the wiring portion corresponding to each of the one or more array portions, according to the detected voltage value.

* * * * *